US011067641B2

(12) United States Patent
Gervedink Nijhuis

(10) Patent No.: US 11,067,641 B2
(45) Date of Patent: Jul. 20, 2021

(54) MEASUREMENT DEVICE AND OPERATING METHODS THEREOF FOR POWER DISTURBANCE INDICATION

(71) Applicant: Fluke Corporation, Everett, WA (US)

(72) Inventor: Erik Johan Gervedink Nijhuis, Hengelo (NL)

(73) Assignee: Fluke Corporation, Everett, WA (US)

( * ) Notice: Subject to any disclaimer, the term of this patent is extended or adjusted under 35 U.S.C. 154(b) by 125 days.

(21) Appl. No.: 16/518,761

(22) Filed: Jul. 22, 2019

(65) Prior Publication Data
US 2021/0025932 A1 Jan. 28, 2021

(51) Int. Cl.
G01R 31/58 (2020.01)
G01R 1/02 (2006.01)
G01R 1/067 (2006.01)
G01R 13/02 (2006.01)

(52) U.S. Cl.
CPC ............ *G01R 31/58* (2020.01); *G01R 1/025* (2013.01); *G01R 1/06788* (2013.01); *G01R 13/02* (2013.01)

(58) Field of Classification Search
CPC .... G01R 31/58; G01R 1/025; G01R 1/06788; G01R 13/02
USPC .......................................... 324/500, 508, 509
See application file for complete search history.

(56) References Cited

U.S. PATENT DOCUMENTS

| | | | |
|---|---|---|---|
| 5,973,501 A | 10/1999 | Reichard | |
| 10,746,767 B2 * | 8/2020 | Worones | G01R 15/181 |
| 10,775,409 B2 * | 9/2020 | Worones | G01R 1/07 |
| 2011/0012589 A1 * | 1/2011 | Greenberg | G01R 15/186 324/127 |
| 2011/0163747 A1 * | 7/2011 | Heckhausen | F41H 11/136 324/259 |
| 2012/0268110 A1 * | 10/2012 | Trunk | H03K 17/9505 324/207.15 |
| 2016/0134705 A1 * | 5/2016 | Medan | G01R 27/2605 324/658 |
| 2018/0136257 A1 | 5/2018 | Steuer et al. | |

FOREIGN PATENT DOCUMENTS

EP 0 702 235 A1 3/1996
EP 3 321 700 A1 5/2018

OTHER PUBLICATIONS

Extended European Search Report for Application No. 20187026.8 dated Dec. 18, 2020, 11 pgs.

* cited by examiner

*Primary Examiner* — Giovanni Astacio-Oquendo
(74) *Attorney, Agent, or Firm* — Seed Intellectual Property Law Group LLP

(57) ABSTRACT

Systems and methods provide for display of a deficiency indicator in response detection of a defined deficiency in an electric signal in an insulated wire. Measurement systems may include a housing sized and shaped to be held in a hand, a set of sensors for sensing a set of electrical characteristics of the electric signal, one or more processors, and a display provided on a surface of the housing. The measurement system may obtain measurements from the set of sensors and detect a presence of the defined deficiency based on the set of measurements. In response to detecting the presence of the defined deficiency, the measurement system may display a deficiency indicator that is representative of the defined deficiency detected.

22 Claims, 9 Drawing Sheets

| DEFICIENCY INDICATORS | INDICATOR SYMBOL | DEFICIENCY CONDITION | DEFICIENCY INFORMATION |
|---|---|---|---|
| VOLTAGE DIFFERENCE WITH NOMINAL | 602 | 604 $V_{MEAS} > V_{NOM} \pm V_{TH1}$ | 638 $V_{NOM}$ ; % DIFFERENCE |
| VOLTAGE WAVEFORM DISTORTION | 606 | 608 $THD(V) > H_{TH1}$ | 640 THD VALUE; HARMONIC CONTRIBUTIONS |
| VOLTAGE VARIATION | 610 | 612 $V_{MEAS} > V_{AVG} \pm V_{TH2}$ | 642 MAX VARIATION; #VARIATIONS |
| SIGNAL DISRUPTION | 614 | 616 $V_{MEAS}(t_i) > V_{NOM} \pm V_{TH3}$ | 644 # DISRUPTIONS |
| CURRENT WAVEFORM DISTORTION | 618 | 620 $\Sigma HV(I) > H_{TH2}$ | 646 THD VALUE; HARMONIC CONTRIBUTIONS |
| CURRENT VARIATION | 622 | 624 $I_{MEAS} > I_{AVG} \pm I_{TH1}$ | 648 MAX VARIATION; #VARIATIONS |
| POWER FACTOR | 626 | 628 $\frac{P}{S} < PF_{TH}$ | 650 POWER FACTOR |
| POWER VARIATION | 630 | 632 $P_{MEAS} > P_{AVG} \pm P_{TH}$ | 652 MAX VARIATION; #VARIATIONS; UPSTREAM/DOWNSTREAM SOURCE |
| VOLTAGE/CURRENT IMBALANCE | 634 | 636 $V_{MEAS} > V_{3\phi} \pm V_{TH4i}$<br>$I_{MEAS} > I_{3\phi} \pm I_{TH2}$ | 654 % DEVIATION, $\phi$ LEFT/RIGHT |

FIG. 6

MEASUREMENT DEVICE AND OPERATING METHODS THEREOF FOR POWER DISTURBANCE INDICATION

BACKGROUND

Technical Field

The present disclosure generally relates to measurement of electrical characteristics, and more particularly, to measurement of electrical parameters in electrical circuits.

Description of the Related Art

Electrical test devices are used for measuring the electrical characteristics of electric signals in electric circuits. For example, voltmeters measure alternating current (AC) voltage and direct current (DC) voltage in an electric circuit whereas ammeters may measure AC and/or DC current flow in an electric circuit. Some electrical test devices may be sized and shaped to allow a user to hold and carry the device. However, this smaller form factor limits the amount of information that the device can provide regarding measurement of an electric circuit. Such devices have a screen that is too small to display information regarding the electric circuit in sufficient detail to allow diagnosis of certain conditions in the electric circuit. Moreover, this class of electric test device may not be configured to provide meaningful information regarding diagnosis of certain conditions. For instance, some of the aforementioned hand-held digital multimeters are configured only to display instantaneous measurements regarding a detected voltage level or detected current level.

At the other end of the spectrum, higher-end electrical test devices have form factors designed for use in controlled testing environments and are configured to display waveforms to a user. Such advanced electrical test devices are typically too large to be held by a user and receive inputs from test probes connected directly to the electric circuit under test. Although these advanced electrical test devices provide a greater level of detail, they are also cumbersome, may be time-consuming to operate, and require the user to possess significant expertise to operate and understand. As a result, it may be difficult, costly, and time-consuming to detect problems in electric circuits in certain settings, such as those where space is limited or in the field.

BRIEF SUMMARY

Embodiments of a measurement system and measurement device disclosed herein have a housing sized and shaped to be held in a hand. The housing contains a set of sensors configured to sense a set of electrical characteristics of an electric signal in an insulated wire without galvanically contacting the insulated wire, the housing is provided with a display and one or more processors located in the housing are operatively coupled to the set of sensors.

The one or more processors in operation receive a set of measurements, from the set of sensors, obtained by the set of sensors during a measurement time interval. The set of measurements are indicative of the set of electrical characteristics of the electric signal in the insulated wire. The one or more processors in operation detect a defined deficiency associated with the electric signal in the insulated wire based on the set of measurements and display, on the display, a deficiency indicator representative of the deficiency associated with the electric signal in the insulated wire in response to detecting the defined deficiency. The one or more processors, in operation, are configured to detect a plurality of defined deficiencies in the electric signal, and the defined deficiency is one of the plurality of defined deficiencies.

In some embodiments, the set of sensors include a voltage sensor located in the housing that, in operation, senses a voltage in the insulated wire without galvanically contacting the insulated wire; and a current sensor located in the housing that, in operation, senses a current in the insulated wire without galvanically contacting the insulated wire. The deficiency indicator may be one of a plurality of deficiency indicators that include a first set of deficiency indicators each representative of a voltage deficiency associated with the electric signal and a second set of the deficiency indicators each representative of a current deficiency associated with the electric signal. The one or more processors, in operation, may cause the display to display the deficiency indicator in a defined area of the display. The deficiency indicator may indicate a type of deficiency condition detected in the electric signal. The one or more processors may cause the display to display alphanumeric characters providing detail regarding the defined deficiency in association with display of the deficiency indicator.

In some embodiments, the one or more processors of the measurement system evaluate whether the set of measurements satisfy a condition of a plurality of conditions, each of the plurality of conditions being associated with a corresponding deficiency indicator of a plurality of deficiency indicators. Detection of the defined deficiency may be based on a determination that one or more measurements of the set of measurements satisfy the condition, and the deficiency indicator displayed is associated with the condition.

In some embodiments, the measurement system includes a wireless communication interface. The one or more processors may, in operation, be configured to cause the wireless communication interface to transmit, via the wireless communication interface, a signal providing information indicating a deficiency indicator associated with the deficiency. The signal may cause a separate processor-based device to display the deficiency indicator to a user.

A method of operation of the measurement device comprises receiving, by a processor of a measurement device, a set of measurements obtained by a set of sensors of the measurement device during a measurement time interval, the set of measurements indicative of the set of electrical characteristics of the electric signal in the insulated wire. The method comprises performing an analysis of the set of measurements, and detecting whether a defined deficiency of a plurality of defined deficiencies is present in the electric signal based on a result of the analysis. The method comprises, in response to determining that the defined deficiency is present in the electric signal, displaying a deficiency indicator that indicates a presence of the deficiency in the electric signal.

Beneficially, the measurement device or system provides a quick indication that an electrical deficiency is present in the electric signal in the insulated wire. The deficiency indication may be in the form of a symbol, image, figure, or other visual indicator that the user may recognize on the display of the measurement device or an associated device. The user may determine that further investigation of the insulated wire or a system associated therewith is warranted based on the deficiency indication, such as by bringing more advanced testing equipment to diagnose the issue. This may be useful in situations where access to the insulated wire under test is limited or where a large number of insulated wires are to be tested. Those skilled in the art may appreciate additional advantages disclosed herein.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

FIG. 6 is a set of example deficiency indicators for display on the display of the measurement system according to one or more implementations;

DETAILED DESCRIPTION

Figure 1:
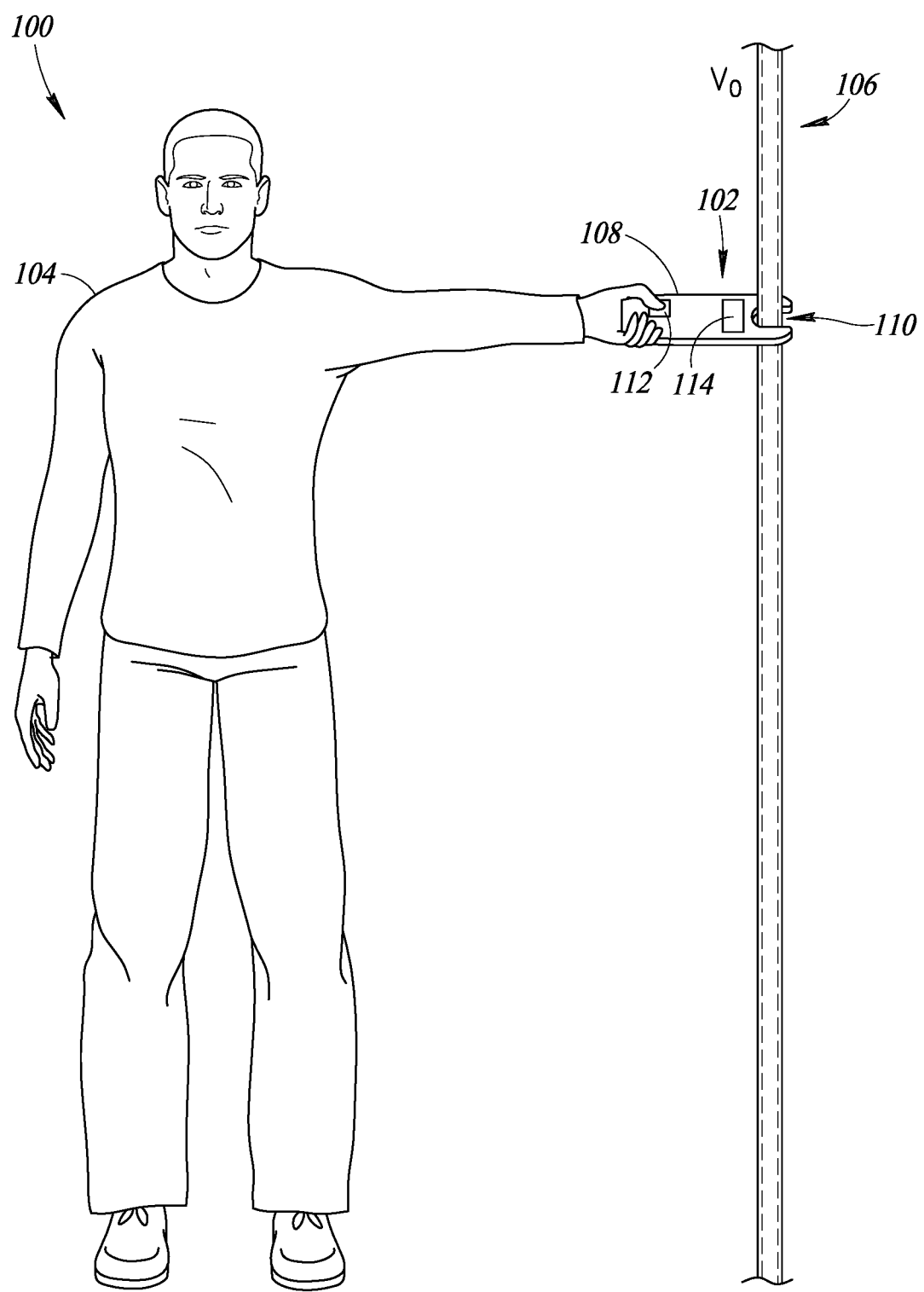
FIG. 1 is a pictorial diagram of an environment in which a measurement system may be used by an operator to measure a set of electrical characteristics of an electric signal present in an insulated wire without requiring galvanic contact with the wire, according to at least one illustrated implementation.

Systems and methods of the present disclosure provide for detection, by a measurement device, of a defined set of deficiencies in an electric signal in an insulated wire and cause a deficiency indicator to be displayed as a result of the deficiency. A deficiency indicator, as used herein, refers to a symbol, icon, or other visual image that is representative of the corresponding deficiency condition detected. In at least some embodiments, the measurement device is configured to measure a set of electrical characteristics in an insulated wire without requiring a galvanic connection between the insulated wire and a test electrode or probe. Generally, "non-contact measurement systems" are disclosed herein which include a housing that includes both a non-contact current sensor and a non-contact voltage sensor. Non-limiting examples of types of non-contact current sensors include magnetic field sensors, such as anisotropic magnetoresistive (AMR) sensors, giant magnetoresistive (GMR) sensors, fluxgate sensors, squid sensors, fiber-optic sensors, optically pumped sensors, nuclear procession sensors, search-coil sensors, magnetotransistor sensors, magneto-diode sensors, magneto-optical sensors, Hall effect sensors, Rogowski coils, current transformers, or other types of magnetic field sensors. Non-limiting examples of types of non-contact voltage sensors capacitive divider type voltage sensors, reference signal type voltage sensors, multi-capacitor type voltage sensors, etc. Example implementations of the voltage and current sensors are discussed in further detail below.

The measurement systems disclosed herein may include a set of sensors that sense electrical characteristics of the electric signal in the insulated wire and one or more processors that receive measurements from the set of sensors. The set of sensors may include a voltage sensor that is configured to generate voltage measurement signals indicative of voltage in the insulated wire, and may include a current sensor that is configured to generate current measurement signals indicative of current in the insulated wire. The respective sensors may generate one or more measurement signals during a common or overlapping measurement time period, which may be relatively short in duration (e.g., 10 milliseconds (ms), 100 ms, 1 second, 10 seconds). For example, the voltage measurement signals and the current measurement signals may be obtained at least partially concurrent with each other. As another example, one sensor of the voltage sensor and the current sensor may obtain a measurement substantially immediately after the other sensor of the voltage sensor and the current sensor obtains a measurement, such that the measurements are obtained at nearly the same time and within a common measurement time interval. In some implementations, the voltage sensor and current sensor may be operative to repeatedly obtain measurements at specified intervals (e.g., every 10 ms, every 100 ms, every 1 second, every 10 seconds). Generally, the voltage and current sensors both obtain their respective measurements within a measurement time interval that is sufficiently short such that pairs of the voltage and current measurements correspond to each other.

As a result of obtaining the set of measurements from the set of sensors, the one or more processors are configured to perform an evaluation of electrical characteristics to detect the presence of deficiencies in the electric signal. The one or more processors may calculate one or more values for or relating to the set of electric characteristics using the set of measurements and determine whether the values indicate the presence of a deficiency in the electric signal. The one or more processors may compare the calculated value(s) with a set of conditions that are associated with possible electrical deficiencies in the electric signal. The possible electrical deficiencies are associated with notifications to be provided in response to a deficiency detection. In at least some implementations, the one or more processors may cause a deficiency indicator to be displayed on a display of the measurement device as a result of detection of the associated deficiency. The deficiency indicator may be displayed in a defined area of the display and have an appearance providing information regarding the deficiency—for example, the shape, color, symbol, or alphanumeric indicator associated with the deficiency indicator. In some embodiments, the one or more processors may cause a signal to be sent from a communication interface of the measurement device indicating the particular electrical deficiency detected.

Beneficially, the measurement device or system provides a quick indication that an electrical deficiency is present in the electric signal in the insulated wire. The deficiency indication may be in the form of a symbol, image, figure, or other visual indicator that the user may recognize on the display of the measurement device or an associated device. The user may determine that further investigation of the insulated wire or a system associated therewith is warranted based on the deficiency indication, such as by bringing more advanced testing equipment to diagnose the issue. This may be useful in situations where access to the insulated wire under test is limited or where a large number of insulated wires are to be tested. Some previous devices (e.g., handheld digital multimeters) were unequipped to quickly detect and indicate such electrical deficiencies and other previous devices (e.g., oscilloscopes) are cumbersome and require significant expertise to use and understand. By contrast, the measurement devices and systems disclosed herein facilitate quick and accurate detection of possible electrical deficiencies in an insulated wire. Moreover, the measurement systems and devices have a hand-held form factor that is portable and does not require access to a power outlet for operation. Further, the measurement systems and devices herein may be operated by a technician in the field without significant training or supervision.

In the following discussion, at least some of the systems and methods discussed involve measuring electric signals in an insulated or blank uninsulated conductor (e.g., insulated wire) without requiring a galvanic connection between the conductor and a test electrode or probe. The implementations disclosed in this section may be referred to herein as "reference signal type voltage sensors" or systems. Generally, a non-galvanic contact (or "non-contact") voltage measurement system is provided which measures an AC voltage signal in an insulated conductor with respect to ground using a capacitive sensor. Such systems which do not require a galvanic connection are referred to herein as "non-contact."

The following description, along with the accompanying drawings, sets forth certain specific details in order to provide a thorough understanding of various disclosed embodiments. However, one skilled in the relevant art will recognize that the disclosed embodiments may be practiced in various combinations, without one or more of these specific details, or with other methods, components, devices, materials, etc. In other instances, well-known structures or components that are associated with the environment of the present disclosure, including but not limited to the communication systems and networks and the environment, have not been shown or described in order to avoid unnecessarily obscuring descriptions of the embodiments. Additionally, the various embodiments may be methods, systems, media, or devices. Accordingly, the various embodiments may be entirely hardware embodiments, or embodiments combining software and hardware aspects.

Before discussing the details of the present disclosure, it is also beneficial to note that throughout the specification, claims, and drawings, the following terms take the meaning explicitly associated herein, unless the context clearly dictates otherwise. The term "herein" refers to the specification, claims, and drawings associated with the current application. The phrases "in one embodiment," "in another embodiment," "in various embodiments," "in some embodiments," "in other embodiments," and other variations thereof refer to one or more features, structures, functions, limitations, or characteristics of the present disclosure, and are not limited to the same or different embodiments unless the context clearly dictates otherwise. As used herein, the term "or" is an inclusive "or" operator, and is equivalent to the phrases "A or B, or both" or "A or B or C, or any combination thereof," and lists with additional elements are similarly treated. The term "based on" is not exclusive and allows for being based on additional features, functions, aspects, or limitations not described, unless the context clearly dictates otherwise. In addition, throughout the specification, the meaning of "a," "an," and "the" include singular and plural references.

References to the term "set" (e.g., "a set of items"), as used herein, unless otherwise noted or contradicted by context, is to be construed as a nonempty collection comprising one or more members or instances.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts). Additionally, reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

Finally, as used in this specification and the appended claims, the singular forms "a," "an," and "the" include plural referents unless the context clearly dictates otherwise. It should also be noted that the term "or" is generally employed in its sense including "and/or" unless the context clearly dictates otherwise. In addition, the headings and Abstract of the Disclosure provided herein are for convenience only and do not interpret the scope or meaning of the implementations.

Turning now to the present disclosure, FIG. 1 shows an environment 100 in which a non-contact measurement system 102 may be used by a user 104 to measure electrical characteristics of an electric signal present in an insulated wire 106 without requiring galvanic contact between the non-contact voltage measurement system and the wire 106. In operation, the user 104 may grasp a housing 108 of the measurement system 102 and position the wire 106 adjacent to a sensing portion 110, which may have a recessed shape, a hooked shape, a V-shape, or other shape for receiving and measuring an electric signal that is present in the wire 106. The user 104 may initiate a measurement procedure by interacting with a user interface 112, which may include buttons, dials, rockers, or touchscreen features. The measurement system 102, in some embodiments, includes a display 114 on which results of the measurement procedure are displayed. As described herein, the measurement system 102 may display one or more deficiency indicators on the display 114 indicating detection of one or more corresponding deficiency conditions in the wire 106.

Figure 2:
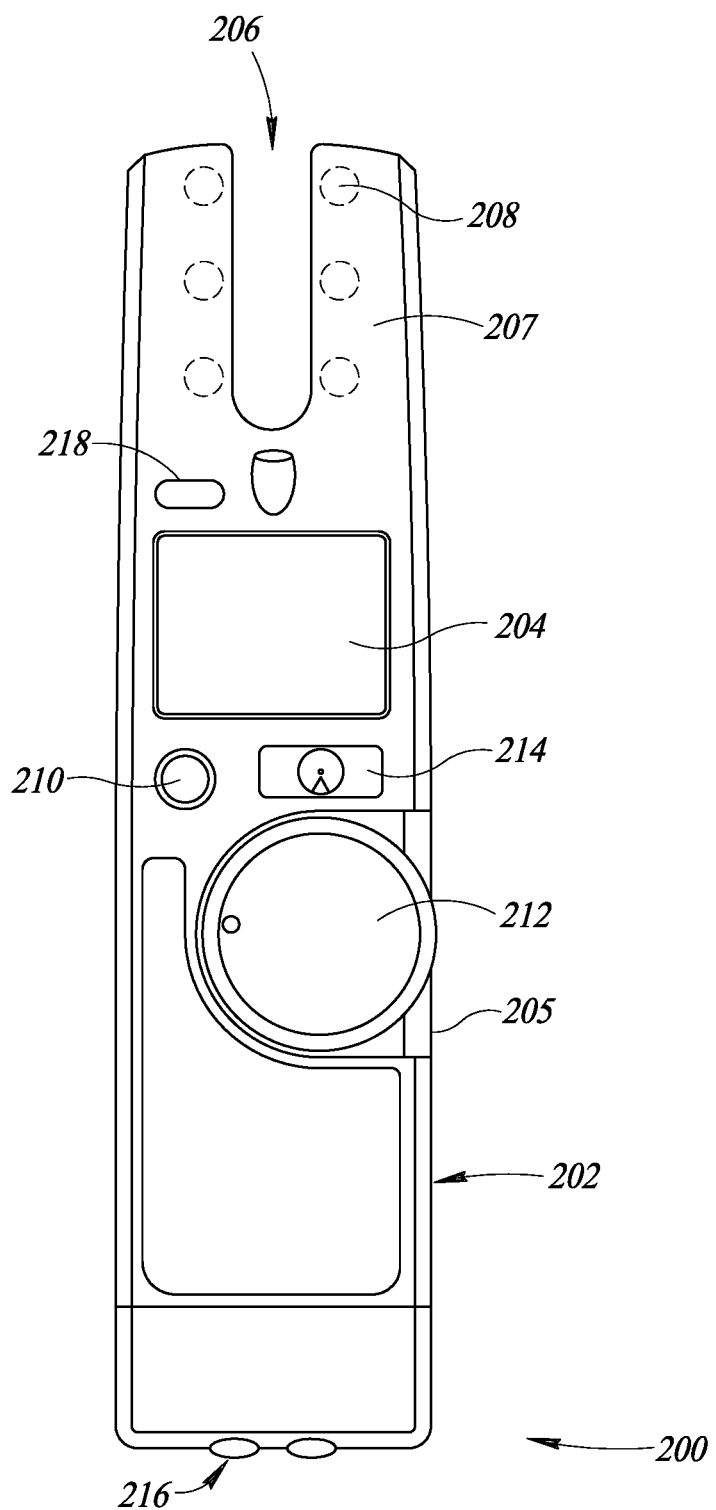
FIG. 2 is a front elevational view of an example measurement system which may incorporate at least some features of the present disclosure.

FIG. 2 shows one embodiment of a measurement device 200 for detecting deficiency conditions and displaying corresponding deficiency indicators. The measurement device 200 includes a housing 202, a display 204 that displays information regarding measurement results, and a sensing portion 206 for non-contact measurement of an insulated wire. The sensing portion 206 of the measurement device 200 is provided at a front-end of the housing 202 and includes a pair of elongated members 207 extending outwardly from a main portion 205 of the housing 202. The insulated wire under test may be received between the pair of elongated members 207 during a measurement procedure. The sensing portion 206 may have different configurations in other embodiments, as described elsewhere herein.

A set of sensors 208 may be provided in the sensing portion 206 for sensing electrical characteristics of an electric signal in the insulated wire under test. The set of sensors 208 may include a voltage sensor that, in operation, senses a voltage in the insulated wire without galvanically contacting the insulated wire, and may include a current sensor that, in operation, senses a current in the insulated wire without galvanically contacting the insulated wire. The sensors 208 may be configured to measure and/or derive various electrical characteristics, including, but not limited to, AC voltage, AC current, DC voltage, resistance, frequency, phase, real power (in Watts (W)), kilowatt-hours (KWh), volt-amperes (VA), volt-amperes reactive (VAR), power factor (PF), total harmonic distortion (THD), inrush current, phase sequence, and voltage drop. The sensors 208 may be embedded within the housing 202 such that surfaces of the sensors 208 are not visible from the exterior of the measurement device 200.

The measurement device 200 may include user inputs (e.g., buttons, dials, switches) that a user may interact with to operate the measurement device 200. For example, a user may press a first input 210 to cause the measurement device 200 to initiate a measurement procedure to obtain measurements of an insulated wire proximate to the sensing portion 206. A settings input 212 may be provided on the main portion 205 to adjust a mode of the measurement device 200. A second input 214 may be provided on the main portion 205 to cause the measurement device 200 to provide additional information regarding a detected deficiency condition in the insulated wire under test. The measurement device 200 may include one or more ports 216 for connecting supplemental probes, sensors, etc.

In some embodiments, the measurement device 200 may include one or more indicator lights 218 configured to illuminate based on detection of one or more deficiency conditions. The indicator lights 218 may be configured to emit colored light (e.g., red light, yellow light, green light) based on whether the one or more deficiency conditions are detected or based on the severity of the deficiency condition detected. The indicator lights 218 may be configured to emit light in certain patterns (e.g., solid, blinking) based on whether the one or more deficiency conditions are detected or based on the severity of the deficiency condition detected.

Figure 3:
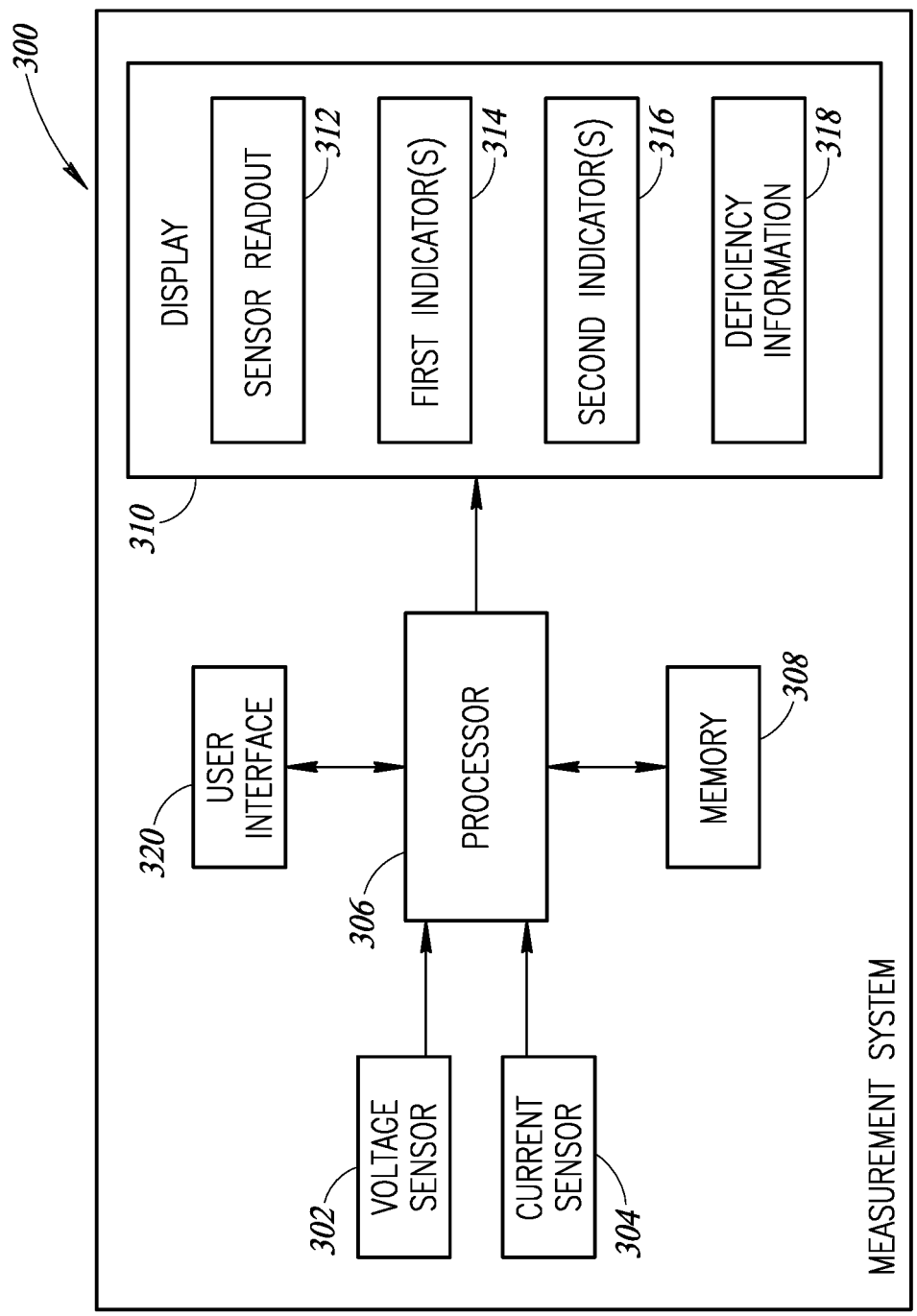
FIG. 3 is a schematic block diagram of a measurement system, according to at least one illustrated implementation.

FIG. 3 shows a schematic block diagram of a measurement system 300 for detecting deficiency conditions and displaying corresponding deficiency indicators according to one or more embodiments. The measurement system 300 determines one or more electrical characteristics (e.g., power, energy, frequency, harmonics, phase) derived from voltage measurements and/or current measurements. The measurement system 300 includes a set of voltage sensors 302 and a set of current sensors 304 that are each communicatively coupled to one or more processors 306.

The processor(s) 306 (individually or collectively referred to herein as "the processor 306") may include one or more logic processing units, such as one or more central processing units (CPUs), microprocessors, digital signal processors (DSPs), application-specific integrated circuits (ASICs), field programmable gate arrays (FPGAs), etc. The measurement system 300 may also include memory 308 communicatively coupled to the processor 306 that stores data and/or instructions thereon. The instructions, as a result of execution by the processor 306, may cause the processor 306 to perform operations described herein. In some embodiments, at least one processor 306 may be part of a controller that includes nontransitory processor-readable storage media communicatively coupled to the at least one processor. The memory 308 may include one or more solid state memories, for instance flash memory or solid state drive (SSD), which provide nonvolatile storage of computer-readable instructions, data structures, program modules and other data for the measurement system 300. Although not depicted, the measurement system 300 can employ other non-transitory computer- or processor-readable media, such as a hard disk drive, an optical disk drive, or memory card media drive.

The voltage sensor(s) 302 may include one or more types of voltage sensors, such as a capacitive divider type voltage sensor, a reference signal type voltage sensor, and a multi-capacitor type voltage sensor. In a measurement system 300 implementing a capacitive divider type voltage sensor, the measurement system 300 operates to generate a variable capacitive voltage between an insulated conductor under test and earth ground. During measurement, the measurement system 300 varies the capacitance of the variable capacitance subsystem to change the impedance of a capacitive divider circuit between the insulated conductor under test and earth ground. By sequentially making two or more measurements across the variable capacitance subsystem, the voltage of the insulated conductor can be determined without requiring any galvanic connection to the insulated conductor.

In a measurement system 300 implementing a reference signal type voltage sensor, the measurement system 300, in operation, senses a reference signal in the insulated wire without galvanically contacting the insulated wire. The one or more processors 306 receives the reference signal and determines an electrical characteristic of the current flowing through the insulated wire based at least in part on the received reference signal. In a measurement system 300 implementing a multi-capacitor type voltage sensor, the measurement system 300 includes a plurality of sensors that each has a different characteristic that affects capacitive coupling. When capacitively coupled with a conductor of the insulated wire under test, a different voltage is detected at each of the sensors, which can be used to accurately determine the voltage in the insulated wire.

Non-limiting examples of types of the current sensor 304 include inductive sensors and magnetic field sensors, such as anisotropic magnetoresistive (AMR) sensors, giant magnetoresistive (GMR) sensors, fluxgate sensors, squid sensors, fiber-optic sensors, optically pumped sensors, nuclear procession sensors, search-coil sensors, magnetotransistor sensors, magnetodiode sensors, magneto-optical sensors, Hall effect sensors, Rogowski coils, current transformers, or other types of magnetic field sensors.

The measurement system 300 includes a display 310 communicatively coupled to the processor 306, which sends signals causing the display 310 to display content according to the set of measurements obtained during the measurement time interval. Non-limiting examples of the display 310 include a liquid crystalline display (LCD) device, a light emitting diode (LED) device, and/or an organic light emitting diode (OLED) device.

The processor 306 is configured to cause the display 310 to present a variety of information to a user. The display 310 may display sensor readouts 312 presenting values for the set of measurements obtained from the voltage sensor(s) 302 and/or the set of measurements obtained from the current sensor(s) 304. The values presented by the sensor readouts 312 may indicate a single measurement taken at an instant in time or a representative measurement indicative of a plurality of measurements taken over a period of time, such as an average or a mean of a plurality of measurements. The sensor readouts 312 may indicate one or more values selected from a voltage amplitude, a current amplitude, frequency, and power. The measurement system 300 may be configured to display values measurements for other electrical characteristics via measurements obtained via the set of ports 216 in some embodiments.

The processor 306 is also configured to cause display of a set of first indicators 314 based on whether the one or more deficiency conditions are detected. In some embodiments, the set of first indicators 314 may be presented or may have an appearance based on the severity of the deficiency condition detected. The first indicator(s) 314 may indicate, for instance, that a deficiency condition was detected by the set of sensors 208 by showing a warning symbol (e.g., icon with exclamation point). The first indicator(s) 314 may further indicate a severity of the deficiency condition detected, e.g., by displaying a warning symbol having a certain color (e.g., red, yellow). In some embodiments, a first indicator 314 may be the indicator light 218.

The processor 306 is further configured to cause display of a set of second indicators 316 based on a type of deficiency condition detected. In particular, the processor 306 is configured to detect a plurality of different types of deficiency conditions according to processes described herein. The processor 306 then causes the display 310 to present a second indicator 316 corresponding to the type of deficiency condition detected. Each of the second indicators 316 may have an appearance representative of the corresponding deficiency condition to facilitate quick and intuitive deficiency condition identification by a user. The memory 308 may store information regarding each deficiency condition and indicator information regarding the corresponding second indicator 316 to be displayed as a result of detecting the associated deficiency condition.

The processor 306 may be configured to cause the display 310 to display additional information 318 regarding the deficiency condition detected. The additional information 318 may be alphanumeric text displayed on the display 310 that provides details regarding the deficiency condition detected—for instance, an amount of total harmonic distortion detected in an electric signal in the insulated wire under test. The additional information 318 may be generated by the processor 306 as a result of calculations involving measurements obtained from the voltage sensor 302 and/or measurements obtained from the current sensor 304. The additional information 318 may be displayed in response to receiving a user input requesting display of the additional information 318.

The measurement system 300 may include a user interface 320 that includes input devices, such as buttons, dials, switches, etc., that affect operation of the measurement system 300. The user interface 320 may include a touch screen, which may be any type of touch screen currently known or later developed. For example, the touch screen may be a capacitive, infrared, resistive, or surface acoustic wave (SAW) device.

The measurement system 300 may be configured to obtain three-phase measurements of systems implementing three-phase power in one or more embodiments. In some embodiments, the measurement system 300 may obtain measurements concurrently from three insulated wires of a three-phase power system, or alternatively the measurement system 300 may sequentially obtain measurements from each of the three insulated wires of the three-phase power system. For instance, the measurement system may take first measurements of a first electric signal in a first wire, then take second measurements of a second electric signal in a second wire, and then take third measurements of a third electric signal in a third wire. The measurement system may then correlate the first, second, and third measurements with each other to determine relationships therebetween, such as phase relationships between the electric signals in the three wires or amplitude relationships between the electric signals in the three wires. In some embodiments, the measurement system 300 may include a plurality of adjustable sensing portions and be configured to simultaneously measure the electric signals of a three-phase power system.

Figure 4:
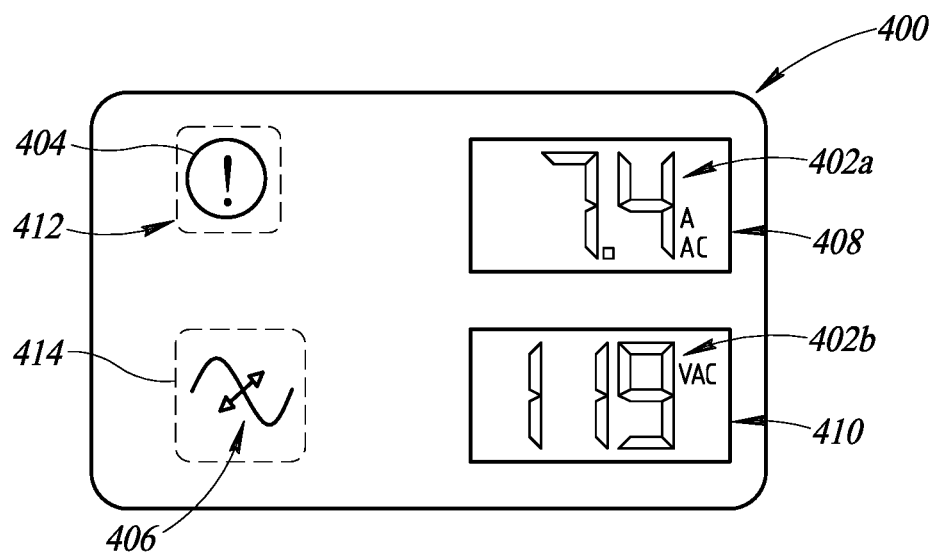
FIG. 4 is a view of a display of a measurement system according to one or more implementations.

FIG. 4 shows a diagram of a display 400 of a measurement system during measurement of an electric signal in an insulated wire according to one or more embodiments. For example, the state of the display 400 may be produced, with reference to FIG. 2, as a result of an insulated wire being positioned proximate to the sensing portion 206 (i.e., between the elongated members 207) and measurement of the electric signal in the insulated wire being initiated by a user pressing the first input 210. The display 400 includes sensor readouts 402 that display values corresponding to the measurements obtained by the set of voltage sensors 302 and/or measurements obtained by the set of current sensors 304. A first sensor readout 402a displays a value corresponding to measured current in the insulated wire and a second sensor readout 402b displays a value corresponding to measured voltage in the insulated wire. The value displayed in each of the sensor readouts 402 may be indicative of a single measurement taken by a corresponding set of sensors or a value representative of a plurality of measurements taken by a corresponding set of sensors, such as a root mean square (RMS) value.

The display 400 may also include a first indicator 404 that is displayed based on detection of one or more deficiency conditions. The first indicator 404 may be displayed in connection with operation of the measurement device to obtain measurements. The first indicator 404 may be displayed as a result of detecting the presence of one or more of the deficiency conditions in the insulated wire. The first indicator 404 may have an appearance that depends on the severity of deficiency condition detected or a number of deficiency conditions detected. For instance, the first indicator 404 may be displayed and have a first appearance (e.g., yellow colored circle with an exclamation point) in response to obtaining measurements in a first range that satisfy a first deficiency condition. The first indicator 404 may be displayed and have a second appearance (e.g., red colored triangle with exclamation mark) in response to obtaining measurements in a second range that satisfy a second deficiency condition. The second range may indicate a more severe deficiency that is associated with greater potential for risk or that exceeds to a greater degree a range of values associated with normal circuit operation. In some embodiments, the first indicator 404 may be displayed and have a third appearance as a result of the absence of detection of a deficiency condition. For example, the first indicator 404 may be a green circle with a check mark therein to indicate that the obtained measurements are in an acceptable range. In some embodiments, the display 400 may display more than one first indicator 404—for instance, one first indicator 404 may be associated with the sensor readout 402a and another first indicator 404 may be associated with the sensor readout 402b.

The display 400 includes a second indicator 406 indicating a type of deficiency condition detected by the measurement system. The display 400 is configured to display a plurality of different indicator types for the second indicator 406 that each represents a different deficiency condition detected in the electric signal in the insulated wire. The processor 306 sends a signal to the display 400 causing the display 400 to display the appropriate indicator type corresponding to the deficiency condition detected. The appearance of the indicator type displayed for the second indicator 406 is representative of the deficiency condition detected. The display 400 will not display the second indicator 406 in the absence of a deficiency condition detection.

Each component displayed may be provided in a defined area of the display 400. The sensor readouts 402a and 402b may be respectively provided in a first area 408 and a second area 410 of the display 400. The first indicator 404 may be provided in a third area 412 and the second indicator 406 may be provided in a fourth area 414 of the display 400. Each of the areas 408, 410, 412, and 414 may be separated from each other.

As a result of the display 400 displaying the first indicator 404 to a user, the user may be quickly alerted to the presence of a deficiency condition of the electric signal in the insulated wire under test. Displaying the second indicator 406, a user can be alerted to the type of deficiency condition detected. The type of deficiency condition may be useful to determine whether to perform additional testing, and may be helpful to determine what advanced testing equipment to implement in the event additional testing is warranted. In some situations, the type and/or severity of a deficiency condition displayed may be helpful to quickly diagnose one problem out of a plurality of known possible problems in a system without implementing additional equipment.

Figure 5:
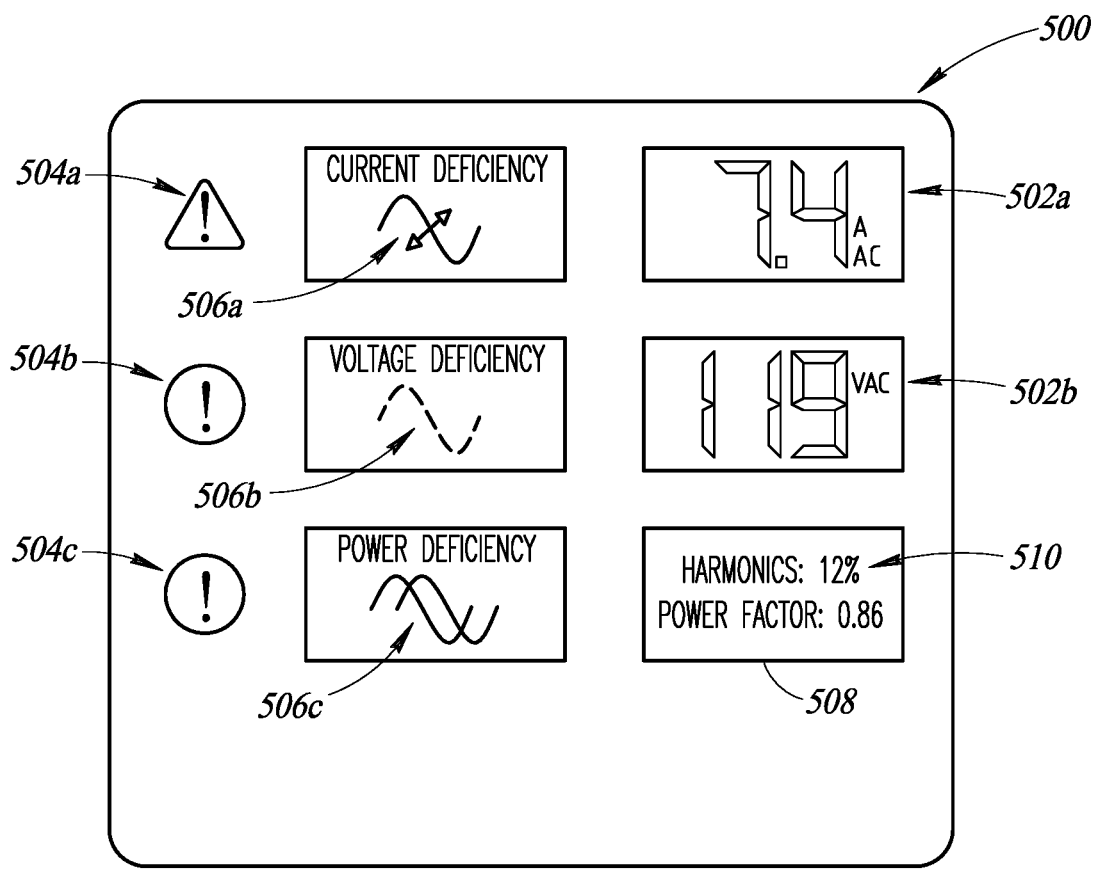
FIG. 5 is a view of a display of a measurement system according to one or more implementations.

FIG. 5 shows a diagram of a display 500 of a measurement system during measurement of an electric signal in an insulated wire according to one or more embodiments. The display 500 includes a plurality of sensor readouts 502a and 502b corresponding to the sensor readouts 402a and 402b described above with respect to the display 400. The measurement system is configured to display, on the display 500, a set of first indicators 504 and a set of second indicators 506.

Individual indicators of the set of first indicators 504 may be associated with a corresponding electrical characteristic. For instance, an indicator 504a of the set of first indicators 504 may be associated with measurement of current in the insulated wire such that the indicator 504a may be displayed or have an appearance based on a deficiency detected in the current in the insulated wire. An indicator 504b of the set of first indicators 504 may be associated with measurement of voltage in the insulated wire such that the indicator 504b may be displayed or have an appearance based on a deficiency detected in the voltage in the insulated wire. An indicator 504c of the set of first indicators 504 may be associated with other characteristics, such as power and phase. Thus, the indicator 504c may be displayed or have an appearance based on a three-phase measurement or difference between the voltage and current measurements (e.g., phase shift). In some embodiments, the set of first indicators 504 may only have a single indicator that is displayed based on the presence of deficiencies detected. In some embodiments, each of the set of indicators 504 may have an appearance (e.g., color, shape) based on a number of deficiencies detected or the severity of the deficiencies detected.

Individual indicators of the set of second indicators 506 may be associated with a corresponding electrical characteristic. An indicator 506a of the set of second indicators 506 may be associated with measurement of current in the insulated wire, an indicator 506b of the set of second indicators 506 may be associated with measurement of voltage in the insulated wire, and an indicator 506c of the set of second indicators 506 may be associated with other characteristics, as described with respect to the set of first indicators 504. Individual indicators of the set of second indicators 506 may be positioned in a defined area adjacent to the associated electrical characteristic and/or the associated first indicator.

The display 500 also includes an area 508 in which additional information 510 is provided regarding one or more detected deficiencies. The additional information 510 includes alphanumeric information providing details to a user regarding the values of the electrical characteristic that satisfy a deficiency detection condition. The additional information 510 may include information such as an amount of harmonic distortion, a power factor, a peak value of a swell in amplitude of an electrical characteristic, a phase difference between measured signals, an amount of distortion, and amplitude or frequency of a detected harmonic, by way of non-limiting example. The processor 306 may cause display of the additional information 510 in response to receiving user input via the user interface 320, such as by receiving an indication that the second input 214 was pressed. In implementations where the user interface 320 includes a touch screen, the user may select one of the set of second indicators 506 to cause the display 500 to present the additional information 510 regarding the second indicator 506 selected.

The measurement system is configured to detect a plurality of deficiency conditions in an electric signal in an insulated wire and display one or more corresponding deficiency indicators of a plurality of the deficiency indicators. FIG. 6 shows a diagram 600 illustrating examples of at least some of the plurality of second indicators 316 that the measurement system is configured to display and the corresponding deficiency condition associated with each of the second indicators 316. The processor 306, in operation, is configured to detect each of the deficiency conditions and cause display of a corresponding deficiency indicator. In some embodiments, the memory 308 may store a set of instructions that specify the conditions and associated indicators. In some embodiments, the processor 306 may be hard programmed (e.g., via configured logic blocks) to detect and cause display of the corresponding deficiency indicator. The measurement system may also display additional information (i.e., as additional information 510 of the display 500) regarding a detected deficiency satisfying one of the aforementioned deficiency conditions. As described herein, the additional information may be displayed in response to receiving a user input requesting the additional information.

The diagram 600 includes a first indicator 602 that corresponds to a voltage difference with a nominal voltage deficiency condition 604. The first indicator 602, when displayed on the display 310, indicates that a difference between a measured voltage and a predefined voltage value exceeds a defined range around a nominal voltage or exceeds one or more predefined thresholds, as evaluated by the processor 306. The nominal voltage level may be dependent upon the range in which the measured voltage is located. For example, if the measured voltage is 118V AC, the processor 306 may determine that the nominal voltage level is 120V AC. The processor 306 may be configured or programmed to detect a plurality of defined nominal voltage levels (e.g., 240 VAC, 120V AC, 12 VDC, 5 VDC). If the measured voltage differs from the nominal voltage by an amount equal to or greater than 5% of the nominal voltage, the processor 306 may determine that the measured electric signal satisfies the deficiency condition 604 associated with the first indicator 602. In response, the processor 306 may cause the display 310 to display the first indicator 602 in a defined area thereof (e.g., adjacent to the sensor readout 502*a*). In connection with detection of a deficiency satisfying the nominal voltage deficiency condition 604, the measurement system may display (as the additional information 510) voltage difference information 638 indicating the detected difference between the measured voltage and the nominal voltage, such as a percentage difference, and may display the nominal voltage level corresponding to the voltage measured.

The diagram 600 also includes a second indicator 606 that corresponds to a voltage waveform distortion condition 608. The second indicator 606, when displayed on the display 310, indicates that a distortion of a voltage waveform exceeds a defined distortion threshold, as evaluated by the processor 306. The processor 306 may determine the presence of a harmonic distortion in the voltage in the electric signal in the insulated wire based on a set of measurements obtained, e.g., by the set of voltage sensors 302. To determine the harmonic distortion present, the processor 306 may obtain measurements over a period of time (e.g., 3 seconds) and calculate a harmonic distortion present in the electric signal. In some embodiments, the harmonic distortion may be calculated by performing Fast Fourier Transform (FFT) using the measurements. In some embodiments, the harmonic distortion may be calculated based on a ratio of root-mean squared (RMS) voltage $V_{rms}$ to fundamental frequency voltage $V_0$.

If the detected harmonic distortion exceeds one or more defined distortion thresholds, the processor 306 may cause the second indicator 606 to be displayed on the display 310. For instance, the processor 306 may determine the presence of the voltage waveform distortion condition 608 if the total harmonic distortion present in a voltage waveform of the electric signal exceeds 8%, or if distortion contribution from a single harmonic exceeds 5%. In response to detection of the voltage waveform distortion condition 608, the processor 306 may cause the display 310 to display the second indicator 606 in a defined area thereof (e.g., adjacent to the sensor readout 502*a*). In connection with detection of a deficiency satisfying the voltage waveform distortion condition 608, the measurement system may display (as the additional information 510) voltage distortion information 640 indicating the harmonic distortion content (e.g., THD, $V_{rms}$ to $V_0$ ratio) of the voltage.

The diagram 600 also includes a third indicator 610 that corresponds to a voltage variation condition 612. The third indicator 610, when displayed on the display 310, indicates that a variation of a voltage waveform corresponding to a set of voltage measurements, e.g., obtained by the set of voltage sensors 302, exceeds a defined variation threshold. The processor 306 may determine a representative voltage value from a plurality of voltage measurements—for example, a moving average of five voltage measurements. If a voltage measurement being evaluated exceeds a defined variation threshold relative to the representative voltage value (e.g., the voltage measurement being evaluated deviates by more than 5% from the calculated representative voltage value), the processor 306 may determine the presence of the voltage variation condition 612. In response, the processor 306 may cause the display 310 to display the third indicator 610 in a defined area thereof (e.g., adjacent to the sensor readout 502*a*). In connection with detection of a deficiency satisfying the voltage variation condition 612, the measurement system may display (as the additional information 510) voltage variation information 642 that may include indication of a maximum variation detected and may include a number of variations detected for the voltage during the measurement interval period.

The diagram 600 includes a fourth indicator 614 that corresponds to a signal disruption condition 616. The fourth indicator 614, when displayed on the display 310, indicates that a disruption of the electric signal was detected by the measurement sensors. Examples of disruptions in the electric signal include swells (sharp increase), dips (sharp decrease), and interruptions (discontinuation of signal) in the electric signal. The processor 306 may determine the occurrence of a disruption based on a change in the measured electric signal in a short measurement period (e.g., half cycle of detected frequency) of more than a predefined amount. If, for example, the processor 306 detects that a change in the measured voltage exceeds a 10% change in a nominal detected level (e.g., greater than 110% of nominal voltage level for a moving average, less than 90% of nominal voltage for moving average) for a half cycle of a 60 Hz signal, the processor 306 may determine the presence of the signal disruption condition 616 and cause display of the fourth indicator 314. The measurement system may further display, as the additional information 510, disruption information 644 indicating a number of disruptions detected in the measurement period interval.

The diagram 600 further includes a fifth indicator 618 that corresponds to a current waveform distortion condition 620. The fifth indicator 618, when displayed on the display 310, indicates that a distortion of a current waveform exceeds a defined distortion threshold, as evaluated by the processor 306. The processor 306 may determine the presence of a harmonic distortion in the current of the electric signal in the insulated wire based on a set of measurements obtained, e.g., by the set of current sensors 304. The harmonic distortion may be determined based on the total harmonic distortion in the current (e.g., FFT of current measurements, ratio of RMS current $I_{rms}$ to fundamental frequency current $I_0$) or based on calculating harmonic content contributed by critical current harmonics (e.g., third harmonic, ninth harmonic, fifteenth harmonic).

If the detected harmonic distortion exceeds one or more defined distortion thresholds, the processor 306 may cause the fifth indicator 618 to be displayed on the display 310. As an example, the processor 306 may determine the presence of the current waveform distortion condition 620 if the sum of contribution to the electric signal due to certain harmonics (e.g., third harmonic, ninth harmonic, fifteenth harmonic) exceeds 5%. In response to detection of the current waveform distortion condition 620, the processor 306 may cause the display 310 to display the fifth indicator 618 in a defined area thereof (e.g., adjacent to the sensor readout 502*b*). In connection with detection of a deficiency satisfying the current waveform distortion condition 620, the measurement system may display current distortion information 646 indicating the harmonic distortion content (e.g., THD, distortion contributed by third harmonic, distortion contributed by ninth harmonic, distortion contributed by fifteenth harmonic) of the current.

The diagram 600 includes a sixth indicator 622 that corresponds to a current variation condition 624. The sixth indicator 622, when displayed on the display 310, indicates that a variation of a current waveform, e.g., obtained by the set of current sensors 304, exceeds a defined variation threshold. The processor 306 may determine a representative current value from a plurality of current measurements—for example, a moving average of five current measurements. If a current measurement exceeds a defined variation threshold relative to the representative current value (e.g., the current measurement being evaluated deviates by more than 5% from the calculated representative current value), the processor 306 may determine the presence of the current variation condition 624. In response, the processor 306 may cause the display 310 to display the sixth indicator 622 in a defined area thereof (e.g., adjacent to the sensor readout 502b). In connection with detection of a deficiency satisfying the current variation condition 624, the measurement system may display current variation information 648 that may include an indication of a maximum current variation detected and may include a number of variations detected for the current during the measurement interval period.

The diagram 600 includes a set of other deficiency condition indicators as well. The measurement system may be configured to display a seventh indicator 626 that corresponds to a power factor deficiency condition 628. The seventh indicator 626, when displayed on the display 310, indicates that the power factor of the electric signal being tested exceeds a defined power factor threshold. The processor 306 may determine the power factor of the electric signal based on a power factor calculation. For example, the processor 306 may calculate a ratio of the real or true power P (measured in Watts) to the apparent power S (measured in Volt-Amps). If the ratio is below a power factor threshold (e.g., below 0.80), the processor 306 may determine the presence of the power factor deficiency condition 628 and cause the display 310 to display the seventh indicator 626. In connection with detection of a deficiency satisfying the power factor deficiency condition 628, the measurement system may display (as the additional information 510) power factor information 650 indicating a power factor value calculated.

The measurement system may be configured to display an eighth indicator 630 corresponds to a power variation condition 632. The eighth indicator 630, when displayed on the display 310, indicates that a variation of a power waveform (determined based on calculation using a set of voltage measurements and a corresponding set of current measurements) exceeds a defined variation threshold. The processor 306 may determine a representative power value from a plurality of measurements—for example, a moving average of power measurement values for corresponding voltage and current measurements. If a power measurement being evaluated exceeds a defined power threshold relative to the representative power value (e.g., the power measurement being evaluated deviates by more than 5% from the calculated representative power value), the processor 306 may determine the presence of the power variation condition 632. In response, the processor 306 may cause the display 310 to display the eighth indicator 630 in a defined area thereof. In connection with detection of a deficiency satisfying the power variation condition 632, the measurement system may display (as the additional information 510) power variation information 652, such as by indicating a maximum power variation or by indicating a number of variations detected for the power during the measurement interval period. Further, the measurement system may indicate a relative direction of the problem, such as whether the deficiency was caused upstream or downstream of the measurement point in the insulated wire.

The third indicator 610, the sixth indicator 622, and the eighth indicator 630 may be similar in appearance, but may each have a distinguishing detail. For instance, the third indicator 610 may include a "V" denoting a voltage variation condition, the sixth indicator 622 may include an "I" denoting a current variation condition, and the eighth indicator 630 may include a "P" denoting a power variation condition.

The measurement system may be configured to display a ninth indicator 634 corresponding to an imbalance condition 636, which may be a condition corresponding to an imbalance between electric signals in two or more insulated wires. The ninth indicator 634, when presented on the display 310, indicates that an imbalance between at least two phases of a three phase system exceeds a defined threshold. The measurement system may be configured to obtain measurements, either sequentially or concurrently, of each of the three insulated wires of a three-phase electric system and compare the measurements to determine differences therebetween. For instance, the measurement system may be configured to obtain a set of voltage measurements of three insulated conductors of a three-phase motor and determine a representative voltage thereof (e.g., the moving average of three measurements). Then, for a subsequent measurement of one of the insulated wires, the processor 306 may determine whether the subsequent measurement exceeds a defined threshold relative to the representative voltage value (e.g., the voltage measurement of one of the insulated wires exceeds a 2% deviation).

The threshold for determining a current imbalance between two or more of the insulated wires under test may be different than the threshold for determining a voltage imbalance. For instance, the threshold for determining a voltage imbalance may be 2% whereas the threshold for determining a current imbalance may be 10%. The ninth indicator 634 may include a detail indicating whether the imbalance condition detected is related to current or voltage, such as by including a "V" or an "I" adjacent to the main icon or symbol. In connection with detection of a deficiency satisfying the imbalance condition 636, the measurement system may display (as the additional information 510) imbalance information 654 that may indicate an amount of deviation (e.g., as a percentage, in unit) or that may indicate a phase relationship of the deficiency (e.g., leading phase, lagging phase).

Figure 7:
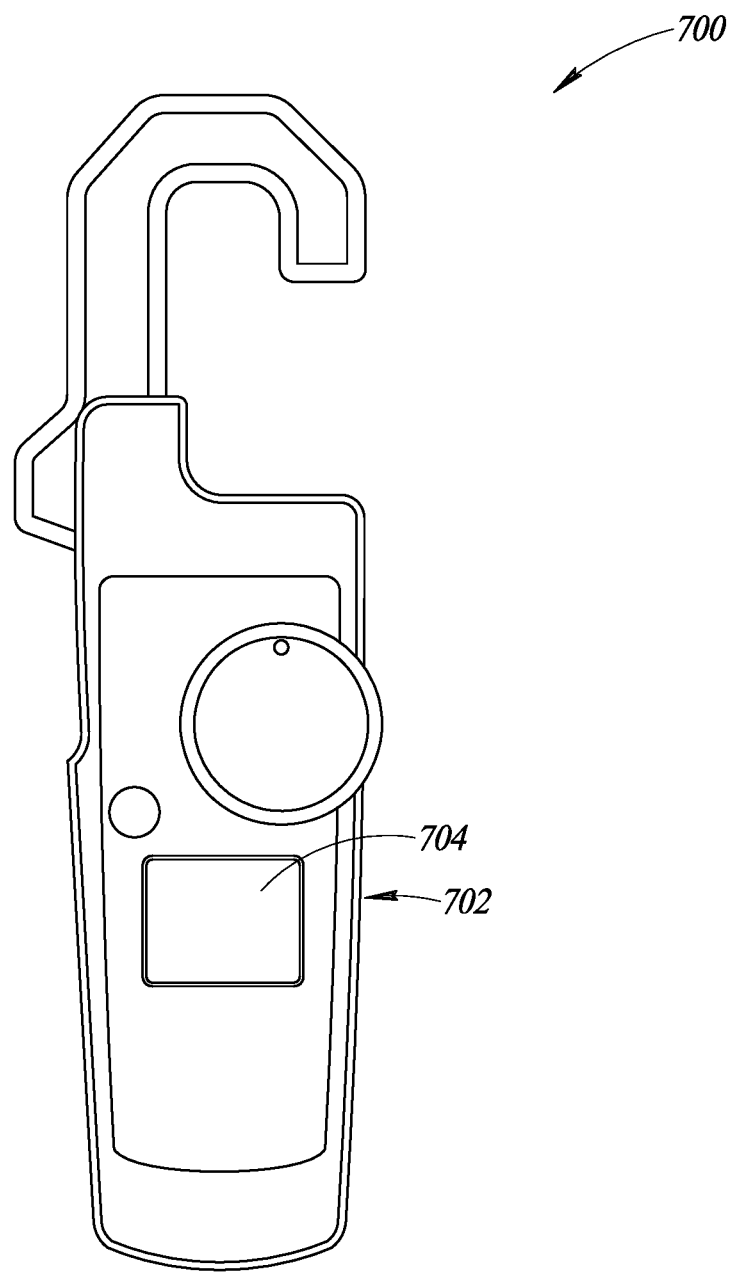
FIG. 7 is a front elevational view of an example measurement system according to one or more implementations.

The measurement device in the measurement system may have different physical configurations than the measurement device 200. FIG. 7 shows a measurement device 700 having a housing 702, a display 704, and a sensing portion 706. The sensing portion 706 of the measurement device 700 has a hooked shape and an opening at a side portion thereof to receive an insulated wire for testing. The sensing portion 706 may be forwardly and backwardly moveable relative to the housing 702 to secure the insulated wire therein. The measurement device 700 is configured to detect the presence of deficiency conditions and display deficiency indicators, as described herein. The measurement device 700 is substantially similar to the measurement device 200 in other respects so further description thereof is not necessary and is omitted.

Figure 8:
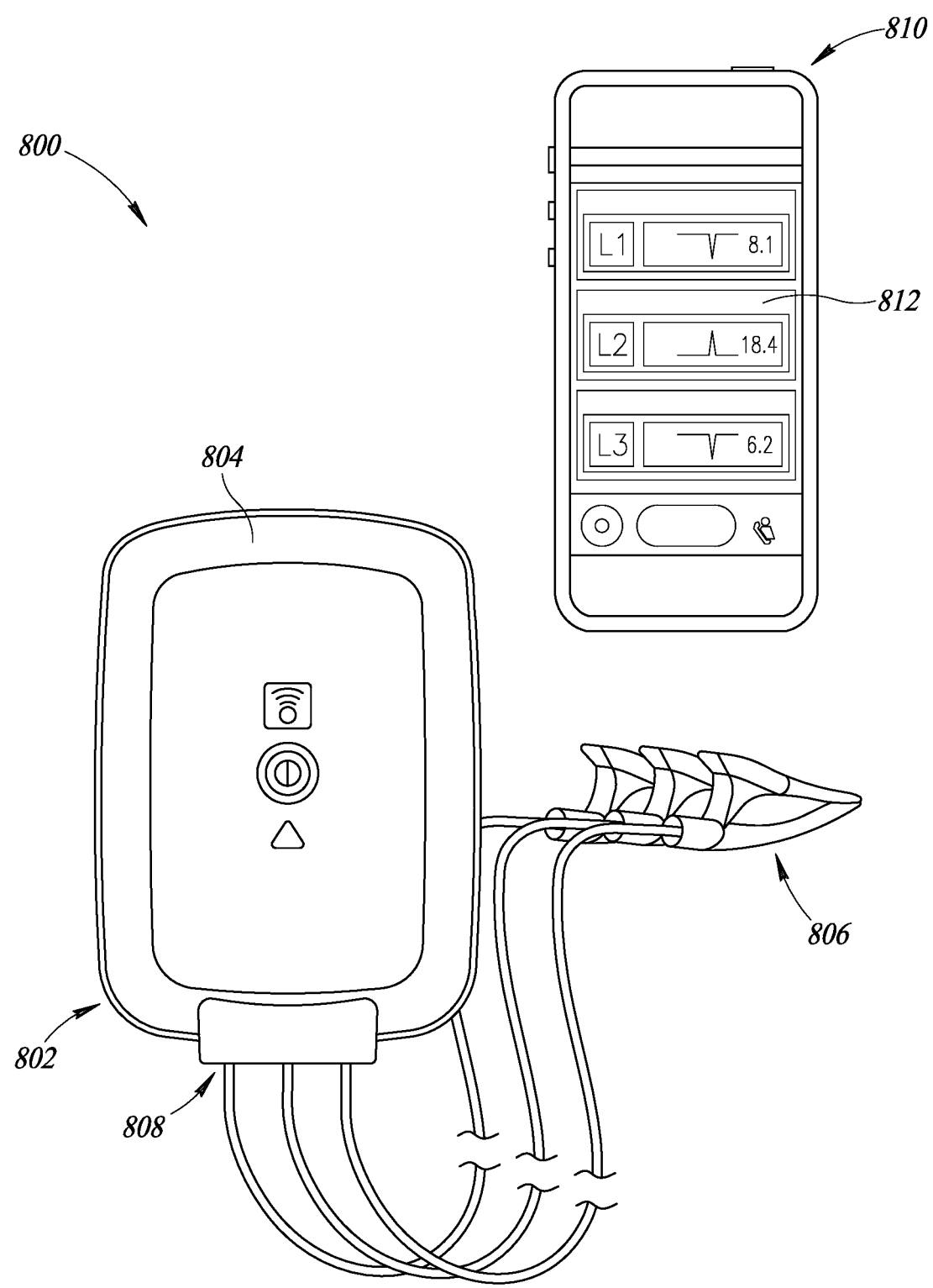
FIG. 8 is a front elevational view of an example measurement system that operates as a remote sensing device according to one or more implementations.

FIG. 8 shows a measurement system 800 configured to concurrently obtain measurements of electric signals of a plurality of insulated wires according to one or more embodiments. The measurement system 800 includes a measurement device 802 that includes a main body 804 coupled to a set of sensor devices 806. The main body 804 of the measurement device 802 may not have a display or may have a relatively small display that is insufficient to present the deficiency indicators described herein. The set of sensor devices 806 may be electrically communicatively coupled to a set of ports 808 on the main body 804. The measurement device 802 may obtain measurements regarding electrical characteristics of electric signals in a set of insulated wires from the set of sensor devices 806. For example, the measurement device 802 may obtain measurements of electric signals in insulated wires of a three-phase power system.

The measurement device 802 may include a wireless communication interface (not shown) for wirelessly communicating with other devices. The communication interface may include one or more wireless communication devices (e.g., network interface, transmitter, transceiver) configured to transmit signals according to one or more communication protocols, such as Bluetooth™, ZigBee™, Z-Wave, Near Field Communication, or cellular mobile communication protocols (e.g., 4G, 5G), or any interne of things or wireless network protocols.

The measurement device 802 is configured to wirelessly communicate with a processor-based device 810 and send signals to the processor-based device 810 based on the measurements obtained. The processor-based device 810 includes a display 812 and a wireless communication interface (not shown). The processor-based device 810 may be a smartphone, a laptop, a tablet computer, or a computing system that is specifically designed to communicate with the measurement device 802, by way of non-limiting example. The measurement device 802 may process the measurements obtained and detect whether the measurements satisfy one or more of the deficiency conditions discussed herein. As a result of determining the presence of one or more of the deficiency conditions, the measurement device 802 may send wireless signals indicating the presence of the one or more detected deficiency conditions according to any of the aforementioned communication protocols. The signals transmitted by the measurement device 802 to the processor-based device 810 cause the processor-based device 810 to display corresponding deficiency indicators (e.g., second indicators 316), as described with respect to the diagram 600). The signals transmitted by the measurement device 802 may also include measurement information corresponding to the measurements by the set of sensors 806 (e.g., voltage measurement information, current measurement information) and may include information corresponding to the additional information 510 described herein.

In some embodiments, the measurement device 802 may receive a communication from the processor-based device 810 that cause the measurement device 802 to initiate measurements by the set of sensors 806. In some embodiments, the measurement device 802 may have one or more user input devices (e.g., buttons, switches) that initiate measurements by the set of sensors 806. Although only three sensors are shown, the measurement device 802 may be configured to couple to more than three sensors. For example, the set of ports 808 of the measurement device 802 may include a first set of ports for coupling a set of current measurement devices and a second set of ports for coupling a set of voltage measurement devices.

Figure 9:
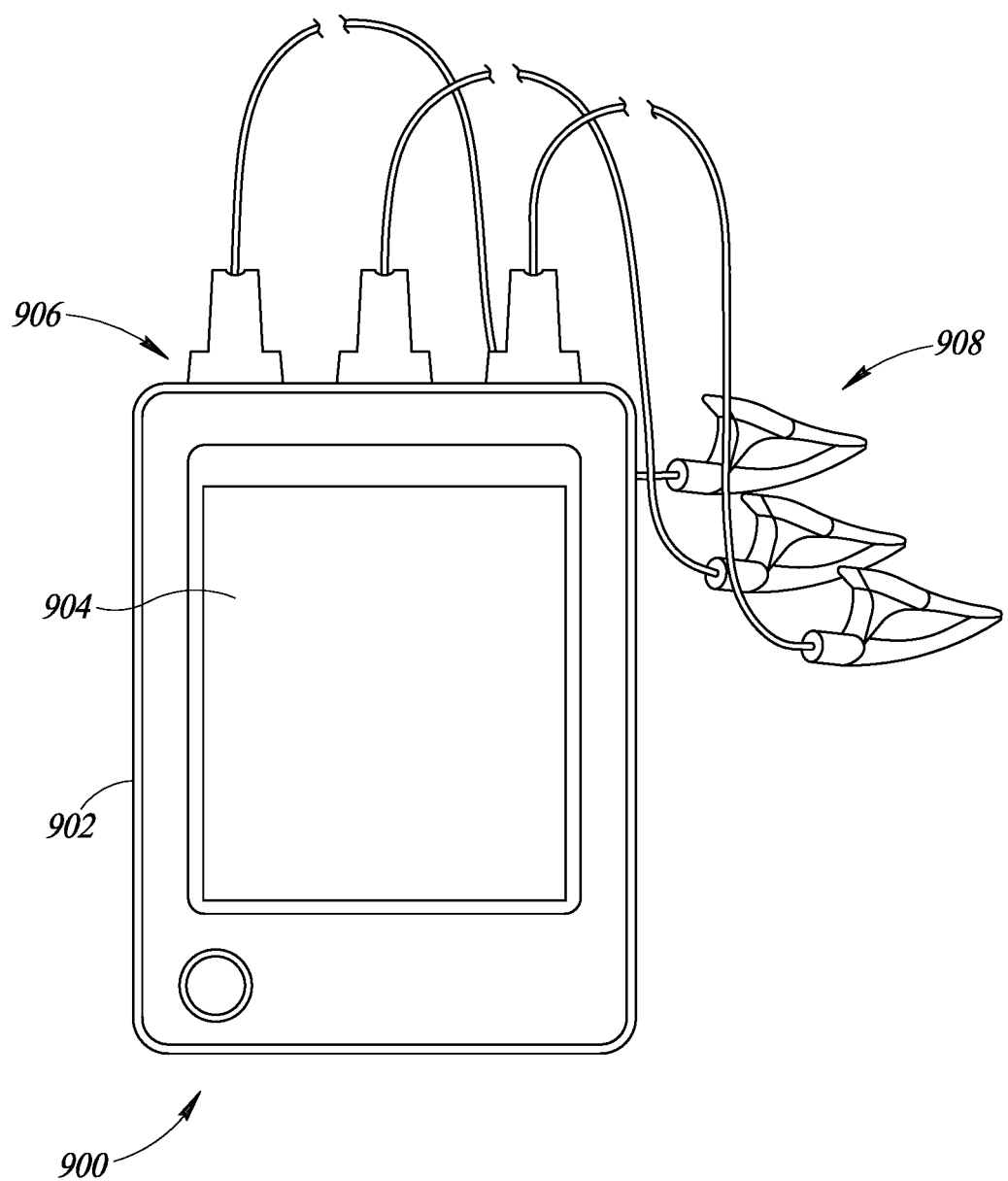
FIG. 9 is a front elevational view of an example measurement system according to one or more implementations.

FIG. 9 shows a measurement device 900 configured to obtain measurements of electric signals of a plurality of insulated wires at the same time according to one or more embodiments. The measurement device 900 includes a main body 902 having a display 904 disposed thereon, and a set of ports 906 for electrically communicatively coupling a set of sensors 908. The measurement device 900 is configured to process the measurements obtained from the set of sensors 908 and detect whether the measurements satisfy one or more of the deficiency conditions discussed herein. As a result of determining the presence of one or more of the deficiency conditions, the measurement device 900 may display one or more of the deficiency indicators discussed herein on the display 904.

The measurement device 802 and the measurement device 900 are otherwise substantially similar to the other devices described herein (e.g., measurement device 200, measurement system 300) so further description thereof is not necessary and is omitted.

Figure 10:
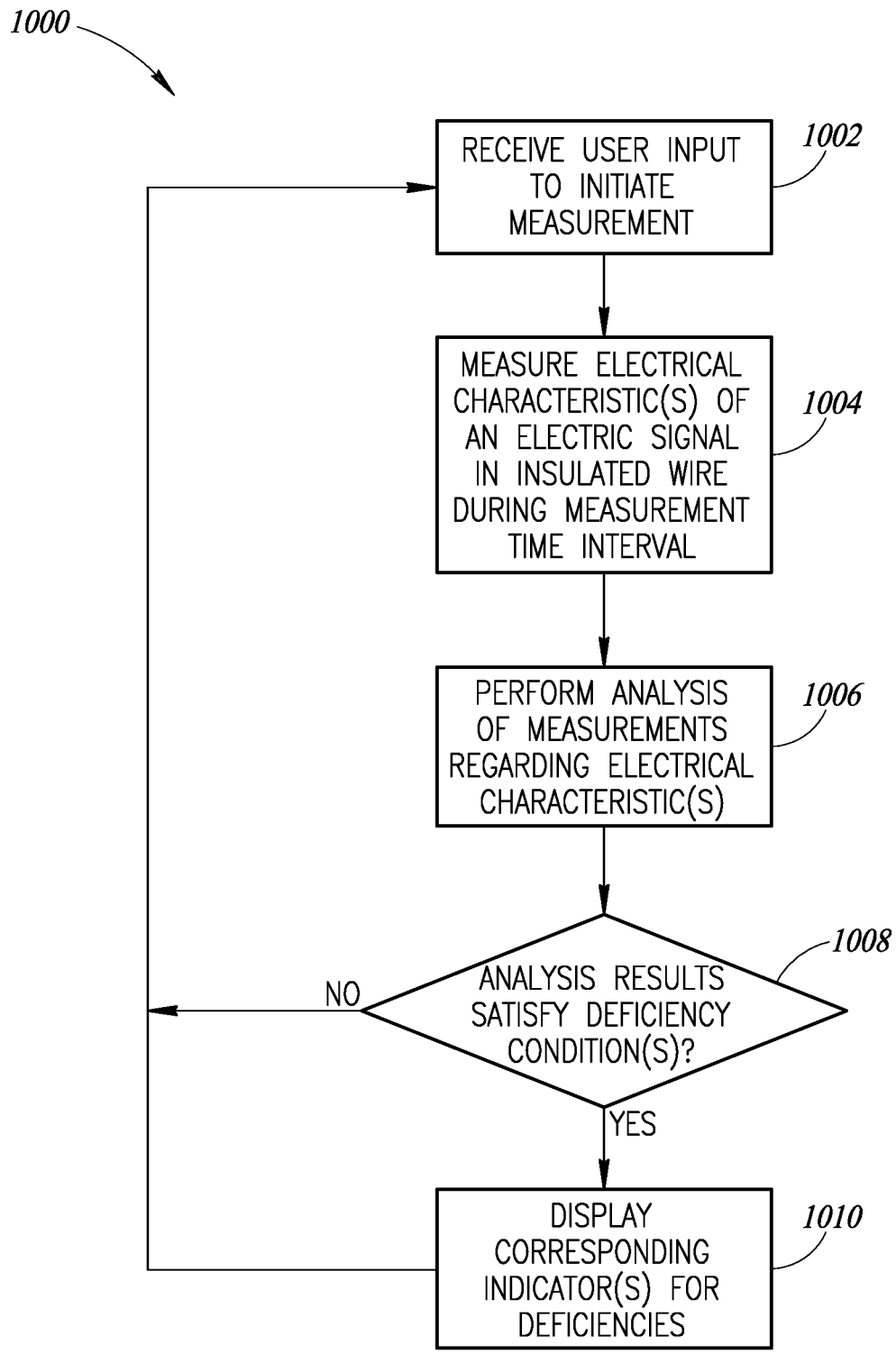
FIG. 10 is a method of operation of a measurement system according to one or more implementations.

FIG. 10 shows a method 1000 for detecting the occurrence of deficiency conditions in one or more insulated wires under test and responsively displaying corresponding deficiency indicators according to one or more embodiments. The method 1000 may be performed by the one or more processors 306 of the measurement system 300, which may include the measurement device 200, the measurement device 802, or the measurement device 900. The method 1000 begins by receiving 1002 a user input to initiate measurements by a set of sensors. The user input may be received via user interaction with a button or touchscreen, or via a wireless communication signal received from an external device (e.g., smartphone, laptop, tablet).

Thereafter, the method 1000 includes measuring 1004 electrical characteristics of an electric signal in an insulated wire during a time measurement interval. For instance, the one or more processors 306 may operate the set of voltage sensors 302 and/or operate the set of current sensors 304 to obtain measurements of the electric signal without galvanic contact with the insulated wire. As one specific example, in a variable capacitance subsystem, the processor 306 may operate a set of switches to selectively couple capacitors with the insulated wire and determine electrical characteristics of the electric signal based on voltage measurements of the coupled capacitors. As another example, the processor 306 may sense a reference signal in the insulated wire without galvanically contacting the insulated wire, and the one or more processors 306 receive the reference signal and determine an electrical characteristic of the signal flowing through the insulated wire based at least in part on the received reference signal.

The processor 306 may determine electrical characteristics (e.g., DC voltage, AC voltage, DC current, AC current, THD, VA) based on the measurements obtained from the set of sensors. In connection with or as a result of measuring 1004 the electrical characteristics, the processor 306 may cause display of signal readouts, as discussed with respect to FIGS. 3, 4, and 5, and elsewhere herein.

The method 1000 involves performing 1006 one or more analyses of the measurements regarding electrical characteristics. In particular, performing 1006 an analysis may include performing one or more of the calculations described herein with respect to FIG. 6. As one example, performing 1006 the one or more analyses may include determining a defined nominal voltage that corresponds to a voltage measurement (e.g., 120 VAC) and determine a difference between the voltage measurement and the nominal voltage, as described with respect to the nominal voltage deficiency condition 604. As a second example, performing 1006 the one or more analyses may include calculating an FFT for a set of measurements, or calculating a ratio of RMS voltage $V_{rms}$ for the set of measurements to a fundamental frequency voltage $V_0$, as described with respect to the voltage waveform distortion condition 608. As a third example, performing 1006 the one or more analyses may include calculating a representative value for a set of measurements, such as calculating a moving average for the last five measurements as described with respect to the voltage variation condition 612. As another example, performing 1006 the one or more analyses may include calculating harmonic contributions to a current in the insulated wire from one or more harmonic frequencies (e.g., third harmonic, ninth harmonic, fifteenth harmonic), as described with respect to the current waveform distortion condition 620. The representative value calculated may be for a subset of measurements of the set of measurements taken over the time interval. The subset of measurements may correspond to a time interval shorter than the measurement time interval.

Performing 1006 the analyses may further include calculating a power factor of the electric signal, e.g., by calculating ratio of real power P (in W) to apparent power S (in VA), as described with respect to the power factor deficiency condition 628. Another example is determining a representative value (e.g., average value, mean value, RMS value) for a plurality of measurements each obtained from a different insulated wire and then determining a deviation, such as an amount or percent difference, of one or more measurements from the representative value, as described with respect to the imbalance condition 636. Other analyses may be appropriate based on the deficiency conditions against which the measurements are to be evaluated.

The method 1000 further includes determining 1008 whether results of the analyses performed in 1006 satisfy one or more deficiency conditions. In particular, a set of deficiency conditions are defined in the measurement system (e.g., in the memory 308) that, if satisfied by the results of the analyses, indicate the presence of corresponding deficiencies in the electric signal in the insulated wire under test. Determining, in 1008, the presence of deficiency conditions may involve comparison of the results of the analyses to defined thresholds or defined ranges, which may be defined in the memory 308 or otherwise logically programmed into the processor 306. The deficiency conditions are discussed with respect to the diagram 600 of FIG. 6 and elsewhere herein. In 1008, the measurement system may identify which deficiency conditions are satisfied by setting a corresponding register or by setting a flag in memory, for instance.

A first example of the deficiency conditions include the nominal voltage deficiency condition 604, which may be satisfied as a result of a voltage measurement differing by more than a certain amount (e.g., 5%) from a determined nominal voltage. Additional examples of the deficiency conditions include the voltage waveform distortion condition 608 and the current waveform distortion condition 620, which may be satisfied if a determined THD value for a set of measurements exceeds a first threshold (e.g., 8%) or contributions to a signal from one or more specific individual harmonic exceed a second threshold (e.g., 5%). With respect to the voltage variation condition 612, the current variation condition 624, and/or the power variation condition 632, the respective conditions may be satisfied if a representative value for a set of measurements exceeds a corresponding deviation threshold (e.g., deviates by more than 5% from representative value).

Another example of a deficiency condition is the signal disruption condition 616, which may be satisfied if a change in an electric signal for a defined short measurement period (e.g., half period for detected frequency period) changes by more than a certain amount (e.g., increases to more than 110% of determined nominal value, decreases to less than 90% of a determined nominal value). The power factor deficiency condition 628 may be determined as satisfied if the power factor for the electric signal of the insulated wire is less than a certain defined power factor (e.g., less than 0.80). Determining whether the imbalance condition 636 is satisfied may include determining whether a measurement value for an electric signal in one insulated wire exceeds a representative value for signals in a plurality of wires (e.g., average of values in three-phase power system) by more than a defined amount—for instance, by more than 2% for voltage or more than 10% for current. The defined thresholds described are provided for illustrative purposes only. The thresholds may be adjusted based on the desired application and a desired operational precision of the system under test.

If one or more deficiency conditions are satisfied in 1008, the method 1000 proceeds to displaying 1010 a corresponding deficiency indicator. Displaying 1010 the deficiency indicator may include sending, by the processor 306, signals that cause one or more of the second indicators 316 to be presented in defined areas of the display 310—for example, displaying one or more of the deficiency indicators of the diagram 600 as the second indicator 406 in the fourth area 414 (see FIG. 4) or as one or more of the second indicators 506 (see FIG. 5). For some of the deficiency conditions, displaying 1010 may include causing the first indicator 314 to be displayed or by adjusting an appearance of the first indicator 314, such as by changing a color or symbol of the first indicator 314. In some embodiments, the processor 306 may not cause display of the first indicator as a result of some deficiency conditions. In some embodiments, the processor 306 may cause illumination of the one or more indicator lights 218 instead of or in addition to display of the first indicator 314.

Displaying 1010 may also include displaying the appropriate additional information 510—for instance, by displaying the voltage difference information 638, the voltage distortion information 640, the voltage variation information 642, the disruption information 644, the current distortion information 646, the current variation information 648, the power factor information 650, the power variation information 652, and/or the imbalance information 654 in the area 508 (see FIG. 5). For cases in which several deficiency conditions are detected, the processor 306 may cause the corresponding types of additional information 510 to be successively displayed, or may cause display of the additional information 510 according to user selection or based on relative importance of the deficiency. In embodiments where a measurement device does not have a display or which have a display insufficient to display the deficiency indicators, displaying 1010 includes sending a wireless signal that causes a second device (e.g., processor-based device 810) to display the appropriate corresponding deficiency indicator.

If no deficiency conditions are satisfied in 1008, the method 1000 returns to receiving 1002 user input to initiate measurement of the electric signal in the insulated wire.

The measurement systems, devices, and operating methods thereof provide for detection of a set of defined deficiency conditions in an electric signal in an insulated wire. In response to detection of a deficiency condition, a corresponding indicator can be displayed to a user that indicates which deficiency condition was detected. This facilitates a quick and clear indication about the quality of an electric signal in an insulated wire in a device with a small display and that is useable in the field—for instance, a measurement instrument that does not require access to a power outlet. The deficiency indicators may warn a user, such as a technician, that more advanced measurements may be needed to determine details about the detected deficiency, such as its influence or cause. The measurement systems and devices disclosed herein may be operated without significant training or supervision. Further, it is possible to determine and indicate deficiencies for both voltage and current in an insulated wire with a single tool according to the measurement systems and devices disclosed herein.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A measurement device, comprising:
   a housing sized and shaped to be held in a hand;
   a set of sensors configured to sense a set of electrical characteristics of an electric signal in an insulated wire without galvanically contacting the insulated wire;
   a display provided on the housing; and
   one or more processors located in the housing, the one or more processors operatively coupled to the set of sensors, wherein in operation the one or more processors:
     receive a set of measurements, from the set of sensors, obtained by the set of sensors during a measurement time interval, the set of measurements indicative of the set of electrical characteristics of the electric signal in the insulated wire;
     detect a defined deficiency associated with the electric signal in the insulated wire based on the set of measurements; and
   display, on the display, a deficiency indicator representative of the defined deficiency associated with the electric signal in the insulated wire in response to detecting the defined deficiency.

2. The measurement device of claim 1, wherein the set of sensors includes:
   a voltage sensor located in the housing that, in operation, senses a voltage in the insulated wire without galvanically contacting the insulated wire; and
   a current sensor located in the housing that, in operation, senses a current in the insulated wire without galvanically contacting the insulated wire.

3. The measurement device of claim 1, wherein the deficiency indicator is one of a plurality of deficiency indicators that include a first set of deficiency indicators each representative of a voltage deficiency associated with the electric signal and a second set of the deficiency indicators each representative of a current deficiency associated with the electric signal.

4. The measurement device of claim 1, wherein the one or more processors, in operation, are configured to detect a plurality of defined deficiencies associated with the electric signal, and the defined deficiency is one of the plurality of defined deficiencies.

5. The measurement device of claim 1, wherein the one or more processors, in operation, cause the display to display the deficiency indicator in a defined area in the display.

6. The measurement device of claim 1, wherein the deficiency indicator indicates a type of deficiency condition detected in the electric signal.

7. The measurement device of claim 1, wherein, in operation, the one or more processors evaluate whether measurements in the set of measurements satisfy a condition of a plurality of conditions, each condition of the plurality of conditions being associated with a corresponding deficiency indicator of a plurality of deficiency indicators,
   wherein detection of the defined deficiency is based on a determination that one or more measurements of the set of measurements satisfy the condition, and the deficiency indicator displayed is associated with the condition.

8. The measurement device of claim 7, wherein the plurality of conditions includes two or more conditions selected from: a difference with a nominal level, a waveform distortion, a variation exceeding an acceptable deviation, a signal disruption event, a signal imbalance between two or more electric signals, and a power factor deficiency.

9. The measurement device of claim 7, wherein the condition is a signal deviation condition related to deviation from a defined signal level of a plurality of defined signal levels, and in operation the one or more processors:
   determine that a difference between the set of measurements obtained during the measurement time interval and a detected defined signal level for an electrical characteristic of the set of electrical characteristics satisfies the signal deviation condition; and
   cause the display to display the deficiency indicator associated with the signal deviation condition as a result of determining that the difference satisfies the signal deviation condition.

10. The measurement device of claim 7, wherein the condition is a harmonic distortion condition, and in operation the one or more processors:
    calculate a harmonic distortion associated with the electric signal based on the set of measurements;
    determine that the harmonic distortion satisfies the harmonic distortion condition; and
    cause the display to display a deficiency indicator associated with the harmonic distortion condition as a result of determining that the harmonic distortion satisfies the harmonic distortion condition.

11. The measurement device of claim 7, wherein the condition is a signal variation condition, and in operation the one or more processors:
    calculate a representative value for a subset of measurements of the set of measurements, the subset of measurements corresponding to a time interval shorter than the measurement time interval;
    determine that a measurement of the set of measurements relative to the representative value satisfies the signal variation condition; and
    cause the display to display a deficiency indicator associated with the signal variation condition as a result of determining that the measurement of the set of measurements satisfies the signal variation condition.

12. The measurement device of claim 7, wherein the condition is a signal disruption condition, and in operation the one or more processors:

determine that a measurement of the set of measurements satisfies the signal disruption condition; and cause the display to display a deficiency indicator associated with the signal disruption condition as a result of determining that the measurement of the set of measurements satisfies the signal disruption condition.

13. The measurement device of claim 7, wherein the condition is a power factor deficiency condition, and in operation the one or more processors:

calculate a power factor associated with a plurality of measurements of the set of measurements;

determine that the power factor satisfies the power factor deficiency condition; and cause the display to display a deficiency indicator associated with the power factor deficiency condition as a result of determining that the power factor satisfies the power factor deficiency condition.

14. The measurement device of claim 7, wherein the set of measurements is a first set of measurements and the insulated wire is a first insulated wire, wherein the condition is an imbalance condition related to imbalance of signals in two or more insulated wires, and in operation the one or more processors:

receive a second set of measurements, from the set of sensors, obtained by the set of sensors during the measurement time interval, the second set of measurements indicative of the set of electrical characteristics of a second electric signal in a second insulated wire;

determine that a deviation between the first set of measurements and the second set of measurements satisfies the imbalance condition; and cause the display to display a deficiency indicator associated with the imbalance condition as a result of determining that the deviation between the first set of measurements and the second set of measurements satisfies the imbalance condition.

15. The measurement device of claim 1, wherein in operation the one or more processors:

cause the display to display alphanumeric characters providing detail regarding the defined deficiency in association with display of the deficiency indicator.

16. The measurement device of claim 15, further comprising:

a user interface, wherein the one or more processors cause display of the alphanumeric characters in response to receiving a user input via the user interface requesting additional information regarding the defined deficiency.

17. A measurement device, comprising:

a housing sized and shaped to be held in a hand;

a set of sensors configured to sense a set of electrical characteristics of an electric signal in an insulated wire without galvanically contacting the insulated wire;

a wireless communication interface; and one or more processors positioned in the housing, the one or more processors operatively coupled to the set of sensors, wherein in operation the one or more processors:

receive a set of measurements, from the set of sensors, obtained by the set of sensors during a measurement time interval, the set of measurements indicative of the set of electrical characteristics of the electric signal in the insulated wire;

determine that the set of electrical characteristics indicates a presence of a deficiency associated with the electric signal in the insulated wire; and transmit, via the wireless communication interface, a signal providing information indicating a deficiency indicator to be displayed, wherein the deficiency indicator is associated with the deficiency.

18. The measurement device of claim 17, wherein the set of sensors includes:

a voltage sensor located in the housing that, in operation, senses a voltage in the insulated wire without galvanically contacting the insulated wire; and a current sensor located in the housing that, in operation, senses a current in the insulated wire without galvanically contacting the insulated wire.

19. The measurement device of claim 17, wherein in operation the one or more processors:

establish a wireless communication channel with a processor-based device according to one or more communication protocols, wherein the signal is transmitted over the wireless communication channel to the processor-based device.

20. A method, comprising:

receiving, by a processor of a measurement device, a set of measurements obtained by a set of sensors of the measurement device during a measurement time interval, the set of measurements indicative of a set of electrical characteristics of an electric signal in an insulated wire;

performing an analysis of the set of measurements;

determining whether a defined deficiency of a plurality of defined deficiencies is present in the electric signal based on a result of the analysis; and in response to determining that the defined deficiency is present in the electric signal, displaying, by the measurement device, a deficiency indicator.

21. The method of claim 20, wherein performing the analysis includes calculating a set of values related to the set of electrical characteristics of the electric signal, and determining whether the defined deficiency is present includes determining whether the set of values satisfies a defined deficiency condition of a plurality of deficiency conditions that respectively correspond to the plurality of defined deficiencies.

22. The method of claim 21, further comprising:

displaying, by the measurement device, a value of the set of values in association with displaying the deficiency indicator.

* * * * *